US011542596B2

(12) United States Patent
Tilsch et al.

(10) Patent No.: US 11,542,596 B2
(45) Date of Patent: Jan. 3, 2023

(54) OPTICAL MONITOR

(71) Applicant: VIAVI Solutions Inc., San Jose, CA (US)

(72) Inventors: Markus K. Tilsch, Santa Rosa, CA (US); Benjamin F. Catching, Santa Rosa, CA (US)

(73) Assignee: VIAVI Solutions Inc., Chandler, AZ (US)

( * ) Notice: Subject to any disclaimer, the term of this patent is extended or adjusted under 35 U.S.C. 154(b) by 234 days.

(21) Appl. No.: 16/459,433

(22) Filed: Jul. 1, 2019

(65) Prior Publication Data
US 2021/0002756 A1 Jan. 7, 2021

(51) Int. Cl.
| *C23C 14/54* | (2006.01) |
| *G01B 11/06* | (2006.01) |
| *B05C 11/10* | (2006.01) |
| *G01N 21/84* | (2006.01) |
| *C23C 14/50* | (2006.01) |

(52) U.S. Cl.
CPC ........ *C23C 14/547* (2013.01); *B05C 11/1005* (2013.01); *B05C 11/1007* (2013.01); *C23C 14/505* (2013.01); *G01B 11/0625* (2013.01); *G01B 11/0641* (2013.01); *G01B 11/0683* (2013.01); *G01B 11/0691* (2013.01); *G01N 21/8422* (2013.01); *G01B 2210/58* (2013.01)

(58) Field of Classification Search
CPC ... C23C 14/042; C23C 14/243; C23C 16/042; C23C 14/505; C23C 14/547; B05C 11/1007; B05C 11/1005; G01N 2021/8416; G01N 21/8422; G01B 11/0683; G01B 11/0625; G01B 2210/58; G01B 11/0691; G01B 11/0641

USPC .............................. 118/712, 713; 156/345.55
See application file for complete search history.

(56) References Cited

U.S. PATENT DOCUMENTS

| 7,534,298 B2 * | 5/2009 | Shanmugasundram ...................... C23C 18/1651 118/320 |
| 7,921,802 B2 * | 4/2011 | De Boer ........... H01L 21/67248 118/696 |
| 2006/0144335 A1 * | 7/2006 | Lee .......................... C23C 16/52 118/719 |
| 2007/0019204 A1 * | 1/2007 | Thomas ............. G01N 21/8422 356/503 |
| 2009/0001282 A1 * | 1/2009 | Hofmeester ............ H01J 37/30 250/424 |
| 2016/0223712 A1 * | 8/2016 | Price ........................ C23C 14/52 |
| 2018/0364160 A1 * | 12/2018 | Aben ..................... G01N 21/86 |

FOREIGN PATENT DOCUMENTS

WO    WO2017098053    *   6/2017

OTHER PUBLICATIONS

International Search Report and Written Opinion for Application No. PCT/US2020/039946, dated Sep. 21, 2020, 11 pages.

* cited by examiner

*Primary Examiner* — Laura Edwards
(74) *Attorney, Agent, or Firm* — Harrity & Harrity, LLP

(57) ABSTRACT

A coating system may include a coating chamber; a substrate holder to move a substrate along a motion path; and a sensor device in the coating chamber, wherein the sensor device is configured to move along the motion path, and wherein the sensor device is to perform a spectral measurement on the substrate.

20 Claims, 5 Drawing Sheets

OPTICAL MONITOR

BACKGROUND

A coating system may be used to coat a substrate with a particular material. For example, a sputtering system may be used for deposition of film layers, such as thin film layers or thick film layers. Based on depositing a set of layers, an optical element may be formed. For example, a thin film may be used to form a filter, such as an optical interference filter.

SUMMARY

According to some implementations, a coating system may include a coating chamber; a substrate holder to move a substrate along a motion path; and a sensor device in the coating chamber, wherein the sensor device is configured to move along the motion path, and wherein the sensor device is to perform a spectral measurement on the substrate.

According to some implementations, a coating system may include a coating chamber; a substrate holder to move a substrate along a motion path; a light source in the coating chamber; a coating source in the coating chamber; a sensor device, wherein the sensor device is configured to move along the motion path as coating is applied to the substrate by the coating source, and wherein the sensor device is to perform a spectral measurement on the substrate based on light generated by the light source; and a processor configured to adjust an operation parameter for the coating system based on the spectral measurement.

According to some implementations, a method may include receiving light from a light source of a coating chamber in which the sensor device is located; performing a spectral measurement on a substrate based on the light, wherein the light is reflected from or transmitted through the substrate, wherein the substrate is in the coating chamber, and wherein the sensor device is stationary in a reference frame of the substrate based on the sensor device and the substrate moving along a motion path; and transmitting information identifying the spectral measurement to a processor.

DETAILED DESCRIPTION

Figure 1:
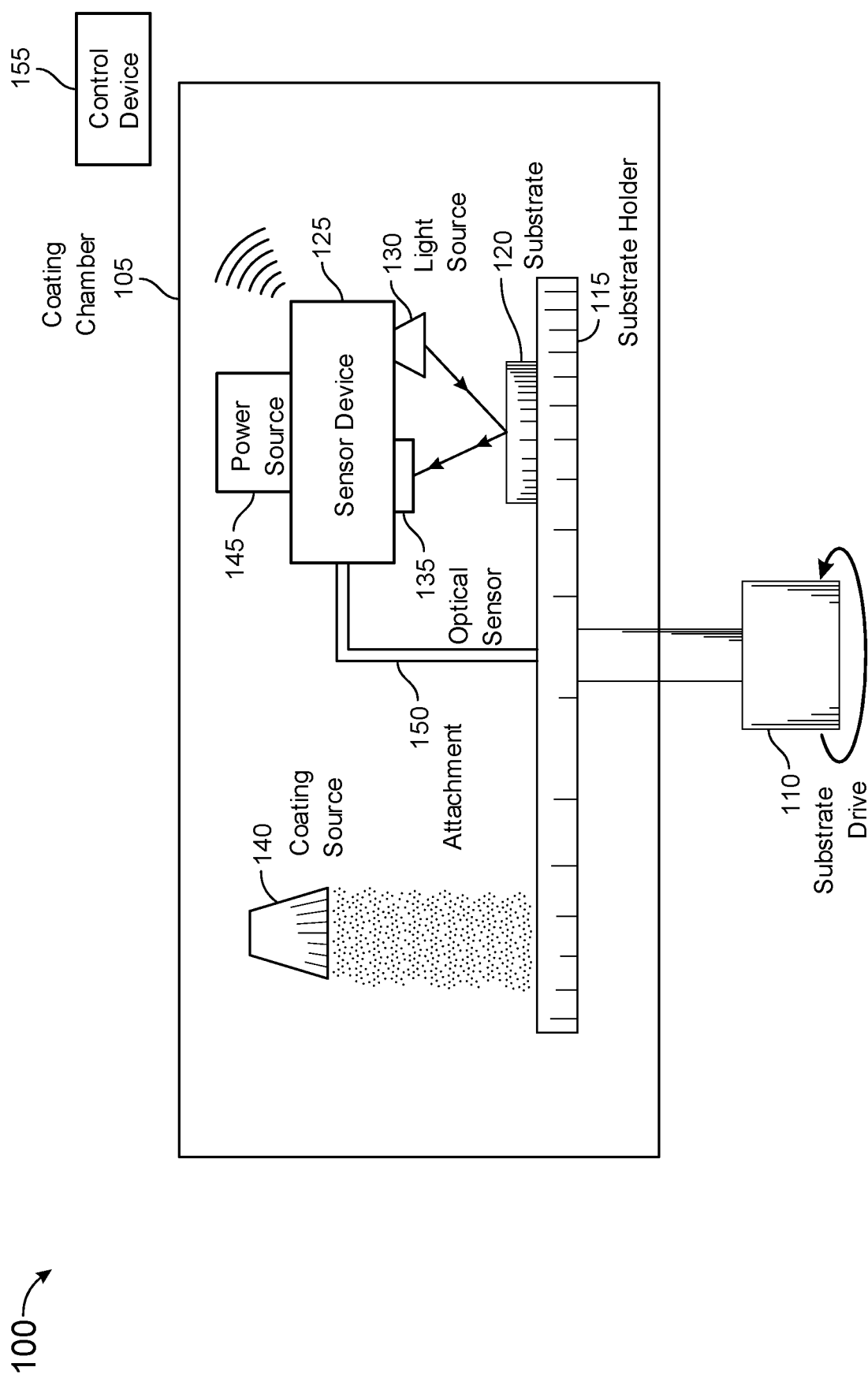
FIG. 1 is a diagram of an example coating system described herein.

The following detailed description of example implementations refers to the accompanying drawings. The same reference numbers in different drawings may identify the same or similar elements.

A coating system may use a coating process (e.g., a sputtering process, an electron beam evaporation process, a thermal evaporation process, a laser ablation process, a physical vapor deposition process, a chemical vapor deposition process, and/or the like) to create an optical element, such as an optical filter. The coating process may be performed in a coating chamber, such as a vacuum chamber. In the coating process, a coating source may be used to generate layers of the optical element. The coating process to generate an optical element may be referred to as a run, and may include the deposition of one or more layers. It may be desirable to create optical elements that have a desired spectral response while controlling a deviation from a desired outcome, which may provide a desired response over a larger substrate (e.g., a substrate for an optical element) or over the deposition of multiple optical elements. In other words, the coating system may control the deviation from the desired outcome in order to maximize uniformity or in order to ensure that a desired outcome is achieved. This desired outcome can be based on the optical properties of the optical element, a thickness of the element, a refractive index of the element, and/or other factors.

Optical monitoring may be employed to achieve the desired spectral response. For example, a measurement (e.g., an optical measurement, a geometric measurement, and/or the like) of the growing filter may be performed as the film is deposited, and deposition may be terminated at a particular time (referred to herein as a cutpoint) when a desired outcome is achieved based on the measurement of the filter. Once all layers of the filter are complete, the desired spectral response may be achieved. In this case, the desired outcome may be accomplished by moving a substrate (or multiple substrates) relative to a coating source of the coating system so that the coating material is more evenly distributed. This may be accomplished using planetary motion, rotational motion, linear motion, and/or the like.

It may be difficult to achieve optical monitoring and substrate motion contemporaneously. For example, for direct optical monitoring, a light beam may be launched and directed at the substrate. The reflected and/or transmitted light may be received and detected by an optical component, such as an optical sensor. This beam path and the corresponding optical component may be fixed in the reference frame of the coating chamber. In some cases, the light source and the optical sensor are in a controls rack, and the light is brought to the machine through fibers. In other cases, these components are mounted at or in the chamber. In a case when the substrate follows a planetary motion path, the substrate may pass through the light beam path in a time-modulated fashion, meaning that the spectral performance cannot be continuously measured.

Furthermore, in some planetary coating systems, multiple substrates are coated at the same time. The coating system may be able to measure the spectrum of more than one of or all of these substrates. However, there may be small differences from substrate to substrate, leading to small systematic differences in the optical spectrum. In such a case, a cutpoint decision may be made based on the information of one individual substrate. Furthermore, the motion of the substrate may mean that the substrate is measured differently (due to the angle of the secondary revolution) when the substrate passes the light beam on different occasions. This may mean that the sampled area of the substrate might be different on different revolutions. The non-uniformity of the substrate can lead to a light modulation that can confuse the cutpoint decision algorithm, thereby leading to inaccurate cutpoint selection for a set of substrates and diminished spectral accuracy.

Some implementations described herein provide a sensor device that travels with the substrate. For example, the sensor device may be stationary in the reference frame of the moving substrate, or may travel along a motion path of the substrate. In some cases, multiple sensor devices may be provided that travel with respective substrates. Additionally, or alternatively, multiple sensor devices or multiple optical sensors may be implemented for a particular substrate. In some implementations, the sensor device may be associated with an in-chamber power source and/or in-chamber processing and/or storage components. By performing spectral (and/or other) measurements using a sensor device that is stationary in the reference frame of the substrate, effects of the movement of the substrate on the spectral measurements may be reduced. Thus, a desired outcome, such as a desired spectral response, may be achieved with improved efficiency relative to measurement using a sensor that is not stationary in the reference frame of the substrate. Furthermore, spectral accuracy and uniformity of optical elements generated by the coating system are improved.

FIG. 1 is a diagram of an example coating system 100 described herein. As shown, coating system 100 may include a coating chamber 105, a substrate drive 110, a substrate holder 115, a substrate 120, a sensor device 125 (shown as in-chamber sensor device 125), a light source 130, an optical sensor 135, a coating source 140, a power source 145, and/or an attachment 150. Furthermore, coating system 100 may be associated with a control device 155, as shown. In some implementations, one or more of the components of coating system 100 may be omitted or may be combined with each other, as described in more detail elsewhere herein. Furthermore, while coating source 140 is shown as depositing a material on substrate holder 115, the motion path of substrate 120 may bring substrate 120 under coating source 140 so that the material is deposited on substrate 120. In this case, coating source 140 is shown separately from substrate 120 for clarity.

Coating chamber 105 is a chamber in which coating system 100 may perform a coating process for substrate 120. In some implementations, coating chamber 105 may be a vacuum chamber and/or may be at least partially evacuated for the coating process. In some implementations, a gas may be introduced to coating chamber 105 as part of the coating process based on an operation parameter, as described in more detail elsewhere herein.

Substrate drive 110 may cause rotation of substrate holder 115. For example, in FIG. 1, coating system 100 uses a rotational motion path for substrate 120. In other words, substrate drive 110 may apply torque to substrate holder 115 so that substrate 120 rotates around a center of substrate holder 115. In some implementations, described elsewhere herein, coating system 100 may use a planetary motion path, a linear motion path, and/or another motion path. Substrate holder 115 holds substrate 120 as substrate 120 moves along the motion path. In some implementations, as described in more detail elsewhere herein, there may be multiple substrate holders 115 and/or substrate drives 110.

Substrate 120 includes an object to which a coating is to be applied using a coating process of coating system 100. For example, substrate 120 may include a substrate on which an optical element (e.g., an optical filter or a different optical element) is to be formed, or may include the optical element. In some implementations, a sensor device (e.g., sensor device 125) may be mounted to substrate 120 or to a cartridge or shell associated with substrate 120.

Sensor device 125 includes a device that determines a spectral measurement and/or a non-spectral measurement based on data from optical sensor 135. For example, sensor device 125 may include a binary multispectral sensor device, a spectrometer (e.g., an infrared spectrometer, a near-infrared spectrometer, a visible-range spectrometer, etc.), and/or the like. In some implementations, sensor device 125 may include a communication and/or computing device, such as a mobile phone (e.g., a smart phone), a tablet computer, a handheld computer, a WiFi transceiver, a Bluetooth transceiver, a near-field communication device, and/or the like. As used herein, a spectral measurement may refer to a measurement performed using light (e.g., an optical measurement, a non-visible-range measurement, an infrared measurement, a near-infrared measurement, and/or the like). A non-spectral measurement may refer to a measurement that is not based on light.

In some implementations, sensor device 125 may include a processor. For example, sensor device 125 may perform a processing operation, a preprocessing operation, and/or the like, on data obtained by optical sensor 135. As one example, sensor device 125 may digitize an optical signal using optical sensor 135, and may provide the digitized signal to control device 155. Additionally, or alternatively, sensor device 125 may perform smoothing, data processing, and/or the like. In such a case, sensor device 125 may provide information based on a spectral measurement or information identifying a spectral measurement (e.g., a measurement value, information identifying a thickness of substrate 120, information identifying a deviation or aberration between different regions of substrate 120, information identifying a modification to an operation parameter of coating system 100, and/or the like). In this way, sensor device 125 may conserve processing resources of control device 155 and/or reduce delay associated with determining information based on spectral measurements. In some implementations, the processor associated with sensor device 125 may be located in coating chamber 105. In some implementations, the processor associated with sensor device 125 may be located outside of coating chamber 105. In some implementations, the processor associated with sensor device 125 may be included in control device 155.

In some implementations, sensor device 125 may include a memory. For example, sensor device 125 may store information identifying a spectral measurement and/or a non-spectral measurement. As a more particular example, sensor device 125 may transmit urgent data to control device 155 (e.g., data for which an action is to be performed immediately, data based on which an operation parameter is to be modified, etc.), and may store non-urgent data for subsequent processing (e.g., log data and/or the like). In such a case, sensor device 125 may transmit the non-urgent information between layers or after a coating run is complete. In this way, sensor device 125 may conserve communication resources that might otherwise be used to indiscriminately provide all data to control device 155.

In some implementations, sensor device 125 may perform a non-spectral measurement. For example, sensor device 125 may include a conductivity sensor, a temperature sensor, and/or the like. Sensor device 125 may use such sensors to perform the non-spectral measurement and/or to determine information regarding a spectral measurement, a cutpoint, and/or the like, as described in more detail elsewhere herein.

In some implementations, sensor device 125 may include a wireless communication interface. For example, sensor device 125 may communicate with control device 155 using the wireless communication interface. As examples, sensor device 125 may communicate with control device 155 using a wireless communication technology such as WiFi, Bluetooth, an optical connection, and/or the like. In some implementations, sensor device 125 may communicate with control device 155 using a wireline connection.

Light source 130 may provide light for a spectral measurement to be performed by sensor device 125. For example, light source 130 may include a laser, a light-emitting diode (LED), a tungsten light source, and/or the like. In some implementations, light source 130 may include multiple LEDs. For example, the multiple LEDs may be configured to illuminate in parallel, in a time multiplexed pattern, and/or the like. In some implementations, the multiple LEDs may be associated with respective wavelengths or may be associated with two or more different wavelengths. In some implementations, sensor device 125 may not include light source 130. For example, light for the spectral measurement may be provided by coating source 140, as described in more detail elsewhere herein. In some implementations, light source 130 or optical sensor 245 may include a dispersive component. In such a case, optical sensor 135 may include an area detector so that a spectrum can be measured in parallel to determine a spectral measurement. In some implementations, light source 130 or optical sensor 135 may include one or more polarization controlling components, thereby enabling sensor device 125 to perform polarization-controlled spectral measurements.

Optical sensor 135 may include a spectral sensor, a multispectral sensor, an image sensor, a light detector, and/or the like. In some implementations, optical sensor 135 may be associated with one or more filters. For example, optical sensor 135 may be associated with a single filter, one or more wavelength pass filters, a bandpass filter, and/or the like.

In some implementations, sensor device 125 may include multiple, different optical sensors 135, or may perform multiple, different spectral measurements using optical sensor 135. As just one example, sensor device 125 may perform a first spectral measurement in the visible range and a second spectral measurement in the infrared range. In some implementations, sensor device 125 may perform the multiple spectral measurements in parallel (e.g., on the same location of substrate 120, on different locations of substrate 120, etc.). The multiple, different spectral measurements may be used to determine or adjust an operation parameter. For example, the multiple, different spectral measurements may be used to determine a deviation or aberration across substrate 120. In such a case, control device 155 may adjust or determine an operational parameter based on the deviation or aberration, as described in more detail below.

Coating source 140 may include a target or target material of the coating process. For example, as part of the coating process, a voltage may be applied to coating source 140 (e.g., at a particular power supply setpoint or power setpoint), which may cause a plasma-based effect on a target material of coating source 140. Through sputtering, target atoms or molecules are ejected, thereby coating substrate 120 at certain parts of the motion path of substrate 120. In some implementations, coating system 100 may include multiple coating sources 140 (e.g., multiple targets), which may be composed of different materials, located in different places in coating system 100, and/or the like.

Power source 145 provides power for sensor device 125. For example, power source 145 may include a battery, a transformer, a generator that generates power based on motion (e.g., motion of substrate drive 110, substrate holder 115, and/or substrate 120), a photovoltaic cell, and/or the like. In some implementations, power source 145 may be included in coating chamber 105. For example, power source 145 may be entirely included in coating chamber 105. In some implementations, power source 145 may be partially included in coating chamber 105. For example, power source 145 may include one or more slip rings and/or the like. In other words, power source 145 may be at least partially internal to coating chamber 105. While power source 145 is shown in proximity to sensor device 125, power source 145 may be located anywhere in coating chamber 105.

Sensor device 125 may be attached to substrate holder 115 by an attachment/attachment arm 150. Attachment 150 may be fabricated of any suitable material and may have any shape. In some implementations, sensor device 125 may be attached to substrate 120. Since sensor device 125 is attached to substrate holder 115 and/or substrate 120, sensor device 125 may move in the motion path of substrate 120. In some implementations, sensor device 125 may be affixed to substrate 120 before substrate 120 is placed on substrate holder 115. For example, sensor device 125 may be affixed to substrate 120 outside of coating chamber 105 or before the coating process begins. In such a case, sensor device 125 may begin measurement outside of coating chamber 105 or before the coating process begins. Thus, coating system 100 may determine a spectral measurement while coating chamber 105 is evacuated, while substrate 120 is heated or cooled, while coating chamber 105 is refilled with atmosphere, and/or the like. This may provide information that is useful for identifying issues that occur during heating or cooling of substrate 120, during evacuation or refilling of coating chamber 105, during contact of substrate 120 with air, and/or the like. For example, this may be useful for detecting issues that arise from contamination in a load lock, which may be detected based on an optical change at a certain temperature, and which may be difficult to detect otherwise. Furthermore, sensor device 125 may perform one or more non-optical measurements outside of coating chamber 105 or before the coating process begins, such as temperature measurements and/or the like.

In some implementations, sensor device 125 may not be attached to substrate holder 115 or substrate 120. For example, when substrate 120 is affixed to a first planetary motion system, sensor device 125 may be affixed to a second planetary motion system associated with a same motion path as the first planetary motion system.

Control device 155 includes one or more devices capable of receiving, storing, generating, processing, and/or providing information associated with controlling or configuring coating system 100. For example, control device 155 may include a server, a computer, a wearable device, a cloud computing device, and/or the like. In some implementations, control device 155 may receive information from and/or provide information to one or more other devices of FIG. 1, such as coating system 100 or, more particularly, sensor device 125. In some implementations, control device 155 may be located in coating chamber 105. In some implementations, control device 155 may be included in sensor device 125 or may be a component of sensor device 125. In some implementations, control device 155 and sensor device 125 may be the same device.

In some implementations, control device 155 may determine or adjust an operation parameter based on the spectral measurement and/or the information identifying the spectral measurement. For example, control device 155 may determine or adjust a cutpoint, a motion path, a geometry between coating source 140 and substrate 120, a movement of a mask associated with coating source 140, a magnetic field strength of coating system 100, a gas flow of coating chamber 105, and/or the like. In some implementations, control device 155 may determine or adjust the operation parameter based on multiple spectral measurements of substrate 120, such as multiple spectral measurements performed in parallel.

In some implementations, control device 155 may determine or adjust an operation parameter based on a non-spectral measurement. For example, control device 155 may receive information identifying measurements of multiple, different sensors, including one or more optical sensors and/or one or more non-optical sensors. Control device 155 may determine or adjust the operation parameter based on the information identifying the measurements of the multiple, different sensors. For example, control device 155 may shorten or lengthen a layer based on a temperature of substrate 120 so that the optical element of substrate 120 has the desired response at ambient temperature. As another example, some dispersive components and optical sensors may change response with temperature. In this case, control device 155 may adjust a spectral measurement based on a measured temperature of a dispersive component, an optical sensor 135, and/or the like. In some implementations, the non-spectral measurement may be determined by sensor device 125 (e.g., as sensor device 125 is stationary in the reference frame of substrate 120). In this way, control device 155 may improve accuracy of spectral measurements and/or operation parameters for coating system 100 using non-spectral measurements and spectral measurements by sensor device 125.

As indicated above, FIG. 1 is provided as one or more examples. Other examples may differ from what is described with regard to FIG. 1.

Figure 2:
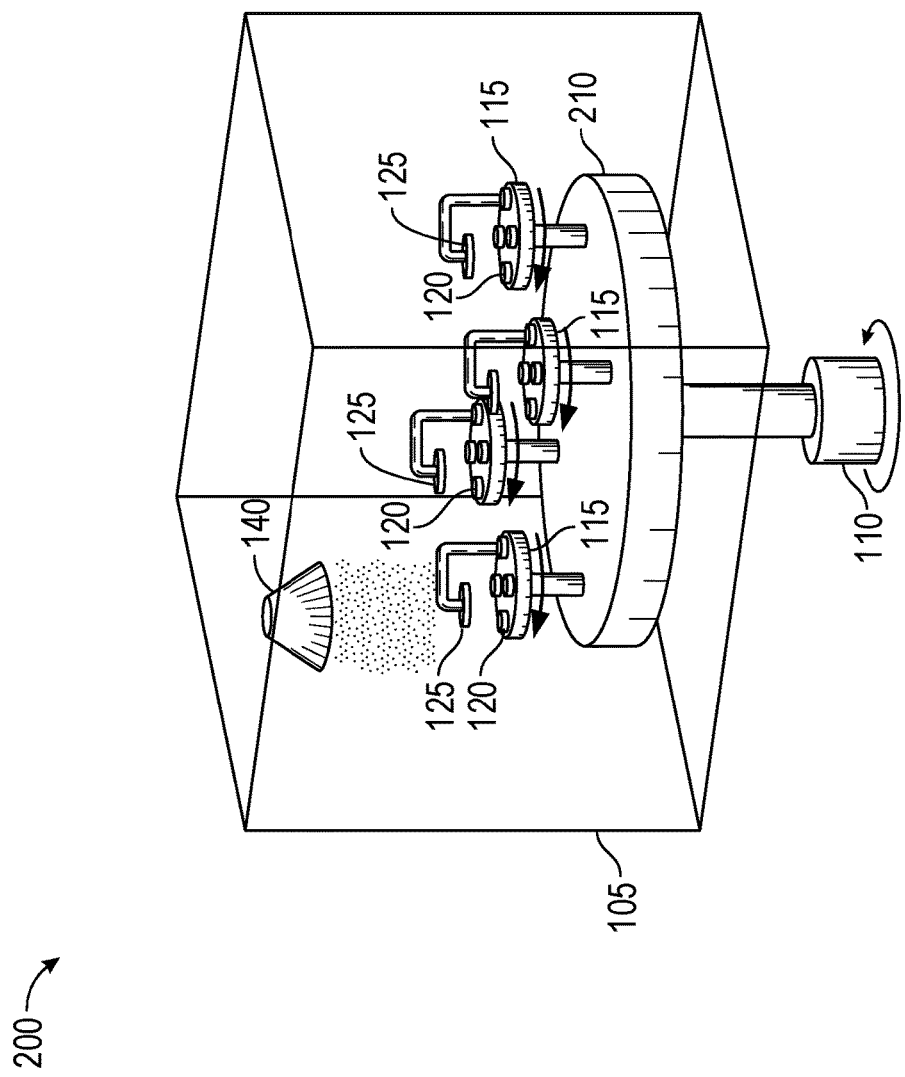
FIG. 2 is a diagram of an example coating system including multiple sensor devices.

FIG. 2 is a diagram of an example configuration 200 of a coating system 100 including multiple sensor devices. As shown in FIG. 2, in some implementations coating system 100 may use planetary motion. For example, substrate holders 115 may be mounted to a primary carrier 210. In this case, planetary motion may be achieved through the use of motors, gears, belts, and/or the like. In this case, substrate holders 115 may rotate so that the substrates 120 are more evenly coated by coating source 140. As further shown, coating system 100 may include multiple sensor devices 125. For example, the multiple sensor devices 125 may be affixed to substrate holders 115 and/or substrates 120. Thus, the multiple sensor devices 125 may move in the motion path of the respective substrates 120 (e.g., may be stationary in the reference frames of the respective substrates 120) and may perform respective measurements on the respective substrates 120 while moving along the motion path with the respective substrates 120, thereby enabling more consistent spectral measurements and therefore more accurate coating control. In some implementations, at least one measurement, of the respective measurements, may be a non-spectral measurement. In some implementations, multiple sensor devices 125 may perform respective measurements on different parts of a substrate 120. The directions of rotation shown in the Figures are provided merely as examples, and any combination of directions of rotation may be used.

As indicated above, FIG. 2 is provided as one or more examples. Other examples may differ from what is described with regard to FIG. 2.

Figure 3:
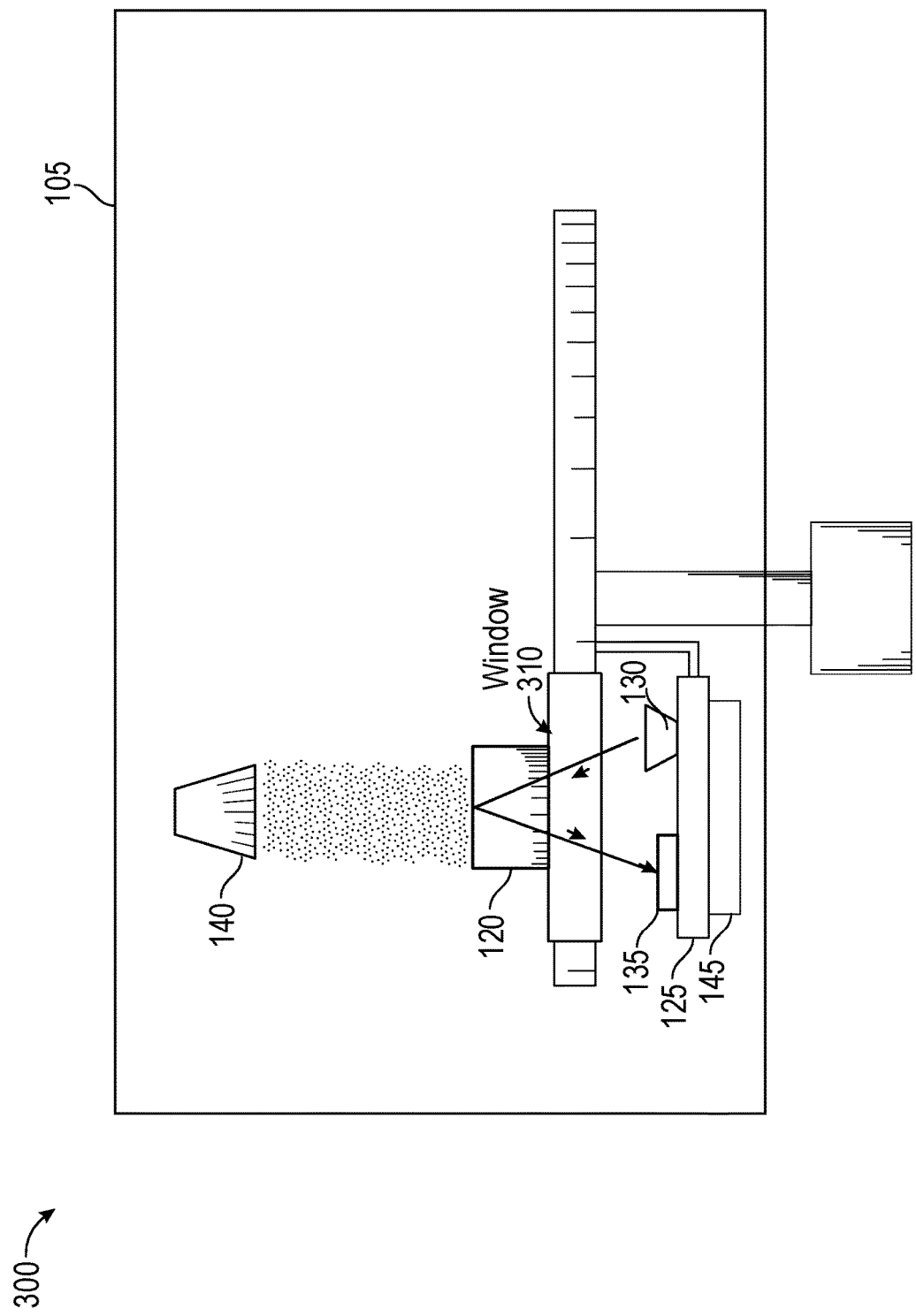
FIG. 3 is a diagram of an example configuration of a coating system.

FIG. 3 is a diagram of an example configuration 300 of the coating system 100. In example configuration 300, sensor device 125 is provided on an opposite side of the substrate 120 than coating source 140, which may shield sensor device 125 from coating flux. In other words, sensor device 125 may be on the same side of substrate 120 as coating source 140 or light source 130, or sensor device 125 and coating source 140 or light source 130 may be on different sides of substrate 120. In this case, the spectral measurement may be performed via a window 310, which may be an optically transparent material. In some implementations, no window 310 may be present. For example, sensor device 125 may perform the measurement directly on substrate 120, or may perform the measurement through a gap in substrate holder 115. In some implementations, light source 130 may be on an opposite side of substrate holder 115 than optical sensor 135. For example, light transmitted by light source 130 may transmit through substrate 120, and sensor device 125 may perform a spectral measurement based on the transmitted light.

As indicated above, FIG. 3 is provided as one or more examples. Other examples may differ from what is described with regard to FIG. 3.

Figure 4:
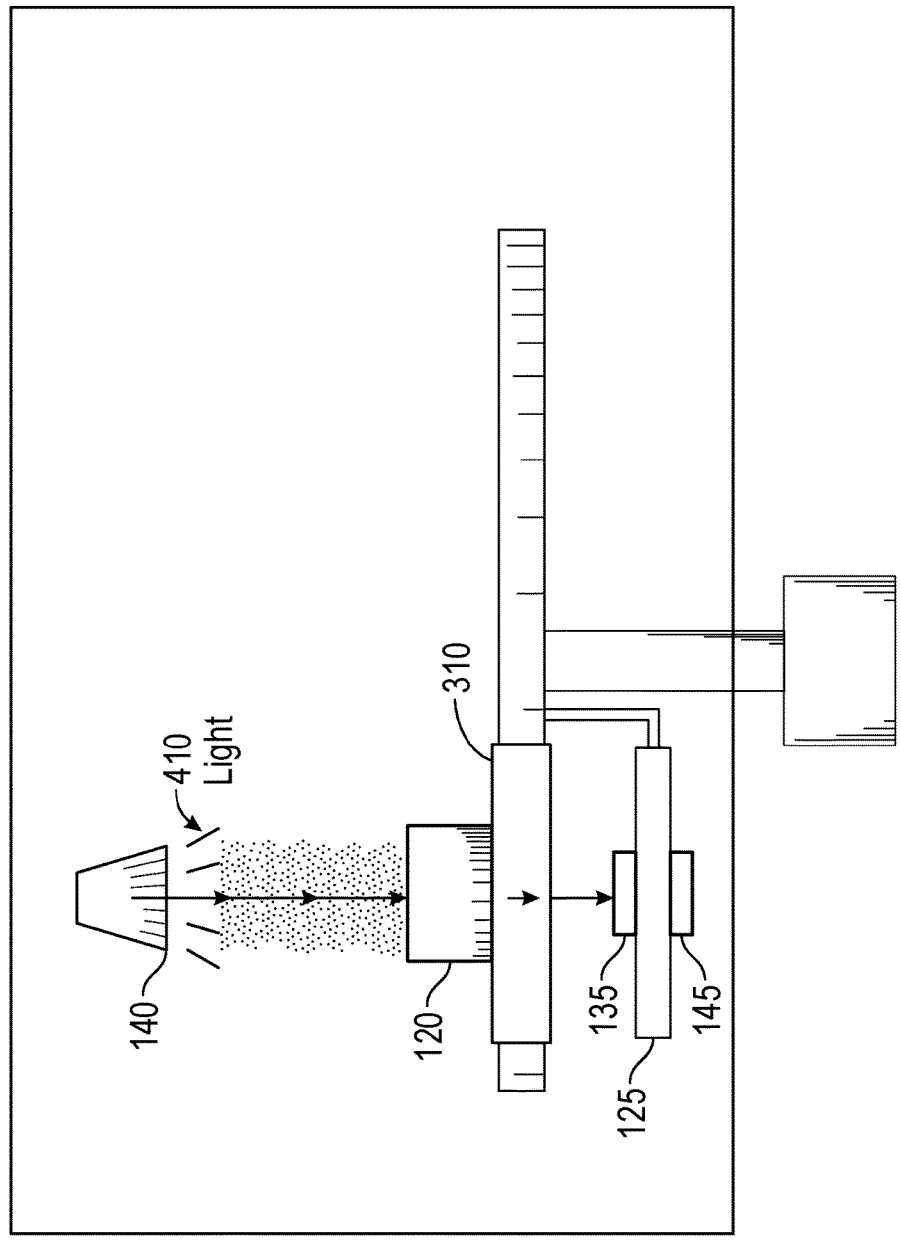
FIG. 4 is a diagram of another example configuration of a coating system.

FIG. 4 is a diagram of another example configuration 400 of the coating system 100. In example configuration 400, and as shown by reference number 410, light is generated by coating source 140. For example, plasma generated by coating source 140 as part of the coating process may provide the light. As further shown, the light may transmit via substrate 120 and/or window 310 to optical sensor 135. In this way, a cost of including a separate light source for sensor device 125 may be reduced and power consumption of the separate light source may be mitigated.

In some implementations, the examples described in connection with FIGS. 1-4 may be combined with each other. For example, coating system 100 may include a plurality of sensor devices 125 that are provided on an opposite side of substrate holder 115 from coating source 140. As another example, coating system 100 may include a plurality of sensor devices 125 that are on an opposite side of substrate holder 115 from light source 130. As yet another example, coating system 100 may include one or more sensor devices 125 on a same side of substrate holder 115 as light source 130 and one or more sensor devices 125 on an opposite side of substrate holder 115 from light source 130.

The angles of incidence between light emitted by light source 130 and substrate 120 that are shown in FIGS. 1-4 are non-limiting. Any angle of incidence may be used, including light that is normal to substrate 130. For example, some arrangement of fibers or beamsplitters may be used to achieve the desired angle of incidence.

As indicated above, FIG. 4 is provided as one or more examples. Other examples may differ from what is described with regard to FIG. 4.

Figure 5:
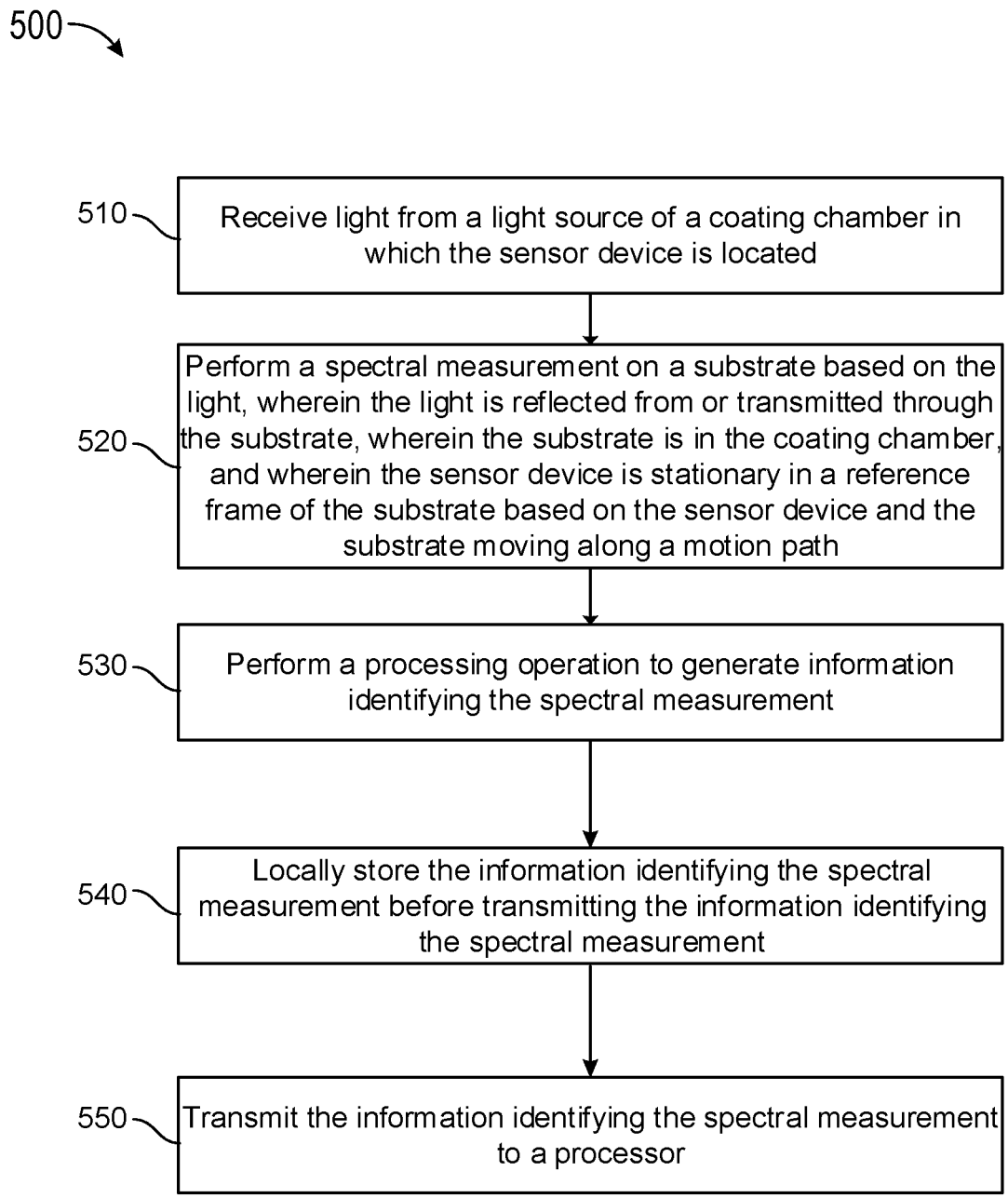
FIG. 5 is a flow chart of an example process for performance of one or more measurements using a sensor device of a coating system.

FIG. 5 is a flow chart of an example process 500 for performing one or more measurements using a sensor device (e.g., sensor device 125) of a coating system, such as coating system 100. In some implementations, one or more process blocks of FIG. 5 may be performed by the sensor device. In some implementations, one or more process blocks of FIG. 5 may be performed by another device or a group of devices separate from or including the sensor device, such as a light source (e.g., light source 130), a control device (e.g., control device 155), and/or the like.

As shown in FIG. 5, process 500 may include receiving light from a light source of a coating chamber in which the sensor device is located (block 510). For example, the sensor device (e.g., using optical sensor 135 and/or the like) may receive light. The light may be from a light source of a coating chamber (e.g., coating chamber 105), such as light source 130 of sensor device 125, coating source 140, and/or the like. The sensor device may be in the coating chamber, as described above. In some implementations, the light is received from plasma of a coating source included in the coating chamber. The light may be reflected from or transmitted through a substrate. For example, the light may be directed to the substrate, and may be modulated by the optical response of the growing film of the substrate. The substrate may be in the coating chamber. The sensor device may be stationary in a reference frame of the substrate based on the sensor device and the substrate moving along a motion path (e.g., concurrently), as described above.

As further shown in FIG. 5, process 500 may include performing a spectral measurement on a substrate based on the light, wherein the light is reflected from or transmitted through the substrate, wherein the substrate is in the coating chamber, and wherein the sensor device is stationary in a reference frame of the substrate based on the sensor device and the substrate moving along a motion path (block 520). For example, the sensor device (e.g., using optical sensor 135, a processor, and/or the like) may perform a spectral measurement on a substrate based on the light.

As further shown in FIG. 5, process 500 may include performing a processing operation to generate information identifying the spectral measurement (block 530). For example, the sensor device (e.g., using a processor of the sensor device, and/or the like) may optionally perform a processing operation to generate the information identifying the spectral measurement, as described above. In some implementations, the processing operation may include digitization, smoothing, a higher-level processing operation, determination of a deviation or aberration in the substrate, determination of a thickness of the substrate, determination of a cutpoint, and/or the like.

As further shown in FIG. 5, process 500 may include locally storing the information identifying the spectral measurement before transmitting the information identifying the spectral measurement (block 540). For example, the sensor device (e.g., using a memory of the sensor device, and/or the like) may optionally locally store the information identifying the spectral measurement before transmitting the information identifying the spectral measurement, as described above.

As further shown in FIG. 5, process 500 may include transmitting information identifying the spectral measurement to a processor (block 550). For example, the sensor device (e.g., using a processor of the sensor device, a wireless communication interface of the sensor device, and/or the like, and/or the like) may transmit information identifying the spectral measurement to a processor, as described above. In some implementations, the processor may be in the coating chamber. In some implementations, the processor may be outside the coating chamber. For example, the processor may be associated with a control device.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A coating system, comprising:
    a coating chamber;
    a substrate holder to move a substrate along a motion path, wherein the substrate holder is in the coating chamber, and
        wherein the substrate holder is a rotary substrate holder;
    a sensor device in the coating chamber,
        wherein the sensor device is configured to move along the motion path,
        wherein the sensor device is to perform a spectral measurement on the substrate, and
        wherein the sensor device comprises a wireless communication interface configured to transmit information identifying the spectral measurement;
    an attachment arm that is connected to the substrate holder and the sensor device;
    a light source; and
    a power source,
        wherein the light source and the power source are connected to the sensor device.

2. The coating system of claim 1, wherein the power source is at least partially internal to the coating chamber.

3. The coating system of claim 1, further comprising:
    an optical sensor, and
        wherein the light source and the optical sensor are on a same side of the sensor device.

4. The coating system of claim 1, further comprising:
    an optical sensor, and wherein the light source and the optical sensor are on different sides of the sensor device.

5. The coating system of claim 1, wherein the sensor device is configured to move along the motion path based on the sensor device being affixed to a planetary motion system.

6. The coating system of claim 1, further comprising:
a plurality of additional sensor devices in the coating chamber configured to move along the motion path of the substrate,
   wherein the plurality of additional sensor devices are configured to perform respective measurements on the substrate while moving along the motion path with the substrate.

7. The coating system of claim 6, wherein at least one measurement, of the respective measurements, is a non-spectral measurement.

8. The coating system of claim 1, wherein the motion path is based on a planetary motion path.

9. The coating system of claim 1, wherein the motion path is around a center of the substrate holder.

10. The coating system of claim 1, wherein the sensor device is under the substrate holder, and
wherein the coating system further comprises a coating source that is above the substrate holder.

11. The coating system of claim 1, further comprising:
a window, wherein the spectral measurement is performed via the window.

12. The coating system of claim 1,
wherein the light source and the power source are under the substrate holder.

13. The coating system of claim 1, wherein the light source and the power source are on different sides of the sensor device.

14. A coating system, comprising:
a coating chamber;
a substrate holder to move a substrate along a motion path, wherein the substrate holder is in the coating chamber;
a light source in the coating chamber;
a coating source in the coating chamber;
a sensor device,
   wherein the sensor device is configured to move along the motion path as coating is applied to the substrate by the coating source, and
   wherein the sensor device is to perform a spectral measurement on the substrate based on light generated by the light source;
an attachment arm that is connected to the substrate holder and the sensor device;
a power source,
   wherein the light source and the power source are connected to the sensor device; and
a processor configured to adjust an operation parameter for the coating system based on the spectral measurement.

15. The coating system of claim 14, wherein the processor is in the coating chamber.

16. The coating system of claim 14, wherein the operation parameter relates to at least one of:
the motion path,
movement of a mask of the coating system, or
a gas flow.

17. The coating system of claim 14, wherein the operation parameter is adjusted based on at least one non-spectral measurement of the substrate or based on multiple spectral measurements of the substrate including the spectral measurement.

18. A method performed by a sensor device, comprising:
receiving light from a light source of a coating chamber in which the sensor device is located,
   wherein the sensor device is connected to the light source and a power source;
performing a spectral measurement on a substrate based on the light,
   wherein the light is reflected from or transmitted through the substrate,
   wherein the substrate is in the coating chamber,
   wherein the sensor device is stationary in a reference frame of the substrate based on the sensor device and a rotary substrate holder moving the substrate along a motion path, wherein the rotary substrate holder is in the coating chamber, and
   wherein an attachment arm is connected to the rotary substrate holder and the sensor device; and
transmitting, using a wireless communication interface of the sensor device, information identifying the spectral measurement to a processor.

19. The method of claim 18, further comprising:
performing a processing operation to generate the information identifying the spectral measurement.

20. The method of claim 18, further comprising:
locally storing the information identifying the spectral measurement before transmitting the information identifying the spectral measurement.

* * * * *